(12) United States Patent
Dilley et al.

(10) Patent No.: US 6,300,018 B1
(45) Date of Patent: Oct. 9, 2001

(54) PHOTOLITHOGRAPHY MASK HAVING A SUBRESOLUTION ALIGNMENT MARK WINDOW

(75) Inventors: John William Luke Dilley, Salem; Marion Wayne Pickens, Eagle Rock, both of VA (US)

(73) Assignee: Tyco Electronics Logistics AG, Steinach/SG (CH)

(*) Notice: Subject to any disclaimer, the term of this patent is extended or adjusted under 35 U.S.C. 154(b) by 0 days.

(21) Appl. No.: 09/399,884

(22) Filed: Sep. 21, 1999

(51) Int. Cl.[7] ................................................... G03F 9/00
(52) U.S. Cl. ................................................. 430/5; 430/22
(58) Field of Search ............................................ 430/5, 22

(56) References Cited

U.S. PATENT DOCUMENTS 5,570,405  10/1996  Chan et al. .............................. 378/35
5,705,320  1/1998  Hsu et al. ............................. 430/313

OTHER PUBLICATIONS

HD MicroSystems, An Enterprise of Hitachi Chemical and DuPont Electronics; "Product Information–Pyralin® PI 2800, PI 5800, PI 2540 Series Polymides".

Primary Examiner—Christopher G. Young
(74) Attorney, Agent, or Firm—McDermott, Will & Emery

(57) ABSTRACT

A photolithography mask having a visible-light-opaque film disposed on a surface of a transparent substrate. The film includes at least one opening that defines an image of a circuit feature, and a window for viewing an alignment mark on an associated wafer. The window has an array of openings in the opaque film, wherein each opening is of a dimension which is substantially below that of the opening defining the image of the circuit feature. Further, a method of aligning the above photolithography mask with a wafer to be patterned. The method comprises the steps of looking through the window of the mask to view the alignment mark on the wafer and positioning the alignment mark of the wafer within the window of the mask.

15 Claims, 5 Drawing Sheets

PHOTOLITHOGRAPHY MASK HAVING A SUBRESOLUTION ALIGNMENT MARK WINDOW

FIELD OF THE INVENTION

This invention relates to photolithography and in particular to a photolithographic mask having an alignment mark window comprised of an array of subresolution openings which prevent the pattern transfer of the alignment mark window to a wafer processed with the mask.

BACKGROUND OF THE INVENTION

Photolithography masks (photomasks) are used in the manufacture of integrated circuits to define circuit features on a wafer. A photomask typically includes a mask substrate having a thin layer of material which defines a pattern of circuit features to be exposed onto the wafer. The pattern layer of circuit features is made of an opaque material which selectively blocks a patterning beam used in photolithography processes. The patterning beam exposes a suitably sensitized film covering the wafer. When the wafer is exposed, the pattern of the photomask is reproduced on the sensitized film. Subsequent processing, such as developing the sensitized film, etching, and the like, in accordance with the particular photolithography technique being used, reproduces the circuit pattern of the photomask on the surface of the wafer to define the desired circuit elements.

When the manufacturing process for the wafer requires multiple masking steps, the subsequent layers to be patterned thereon require the alignment of their photomasks to the patterns on the substrate from the previous masking layers. Therefore, in addition to the circuit pattern on the mask substrate, one or more alignment mark windows are formed in the opaque material of the photomask which have a known position relative to the circuit features in the pattern. The alignment mark windows are used to view features on the wafer called alignment marks. Accordingly, the alignment marks on the wafer are referenced to features on the mask. The alignment mark windows must be large enough to view the alignment marks on the wafer.

Certain photolithography techniques require the alignment marks on the wafer to be directly opposite the alignment mark windows of the mask. Consequently, when the wafer is exposed, the alignment mark window pattern is also transferred to the wafer.

For some processes, transfer of the alignment mark window pattern to the wafer is undesirable. This occurs when the transfer of the alignment mark window pattern destroys the alignment mark on the wafer so that it is no longer useful for subsequent alignment steps.

The transfer of the alignment mark window pattern to the wafer may also be undesirable when the process steps are incompatible with the material on the wafer around the alignment mark. This incompatibility may cause lower yields.

Therefore, a photomask is needed which prevents the transfer of the alignment mark window pattern to the wafer during wafer processing.

SUMMARY OF THE INVENTION

A photolithography mask comprised of a visible light-opaque film disposed on a surface of a transparent substrate. The film has at least one opening that defines an image of a circuit feature and a window for viewing an alignment mark on an associated wafer. The window includes an array of openings in the opaque film, wherein each opening has a dimension substantially below that of the opening defining the image of the circuit feature.

Another aspect of the invention involves a method of aligning the above photolithography mask with a wafer to be patterned. The method comprises the steps of looking through the alignment mark window to view the alignment mark on the wafer and positioning the alignment mark of the wafer within the alignment mark window of the mask.

BRIEF DESCRIPTION OF THE DRAWINGS

The advantages, nature, and various additional features of the invention will appear more fully upon consideration of the illustrative embodiment now to be described in detail in connection with accompanying drawings wherein.

It should be understood that the drawings are for purposes of illustrating the concepts of the invention and are not to scale.

DETAILED DESCRIPTION OF THE INVENTION

Figure 1A:
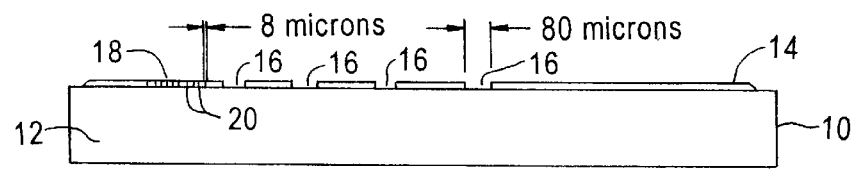
FIG. 1A is an elevational view of a photolithography mask according to an embodiment of the invention.
Figure 1B:
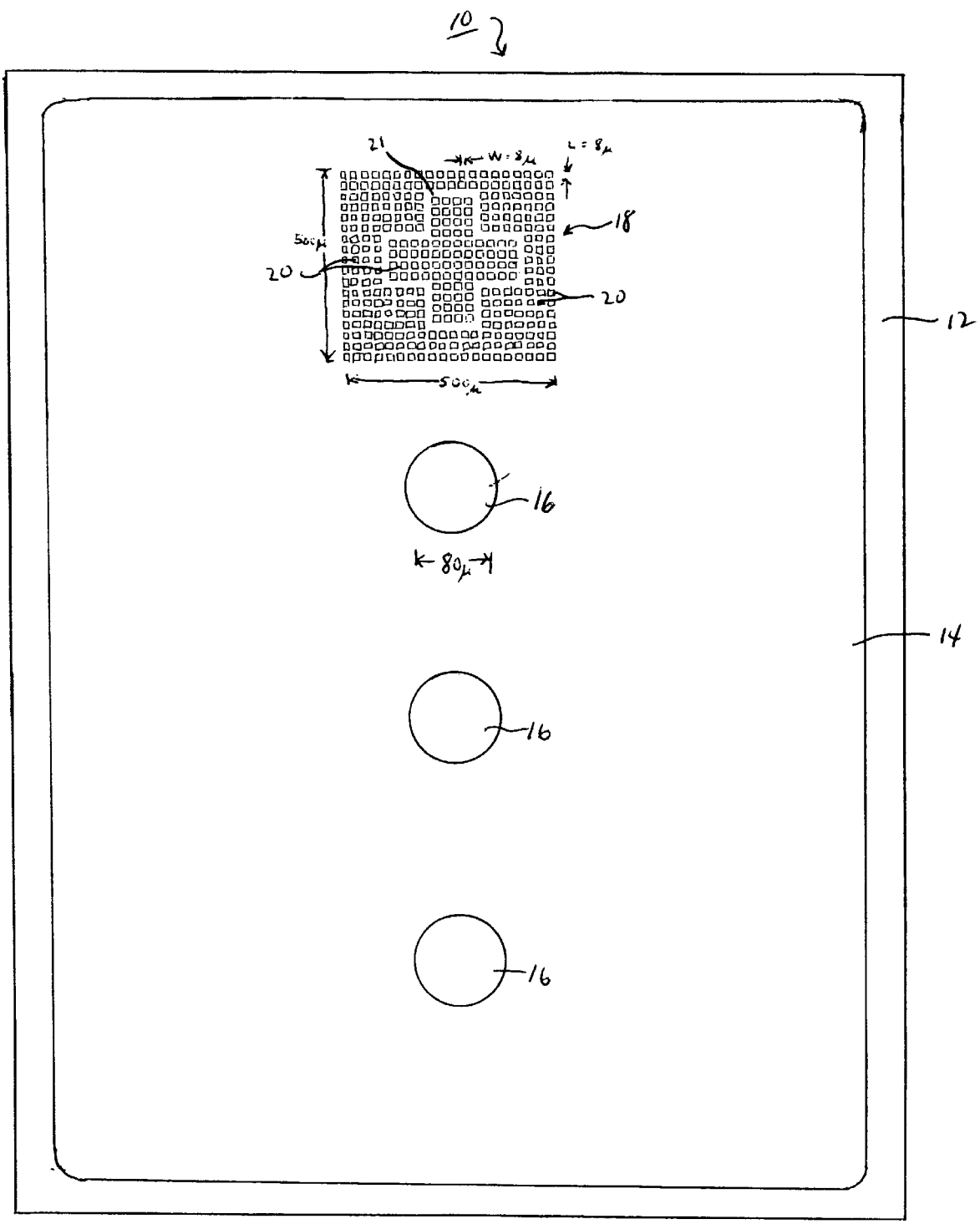
FIG. 1B is a plan view of the photomask shown in FIG. 1A.

FIGS. 1A and 1B show a photolithography mask 10 (photomask 10) according to an embodiment of the invention. As seen in FIG. 1A, the photomask 10 comprises a transparent substrate 12 covered on one surface with a visible-light opaque film 14. The substrate 12 and film 14 are typically composed of glass and chromium respectively, and each have a thickness which is standard for photomasks.

As seen in FIG. 1B, a pattern of openings 16 is defined in the opaque film 14. This pattern 16 forms an image of one or more features of an integrated circuit. Such features usually comprise the network wiring interconnections which makeup the electrical circuitry of a completed semiconductor chip. The image formed by the pattern of openings 16 can also be of a mechanical feature. Such mechanical features can include transducer diaphragms and other like elements commonly patterned into wafers.

Also defined in the opaque film 14 shown in FIG. 1B is at least one subresolution alignment mark window 18. The window 18 consists of an array or pattern of subresolution openings 20 in the opaque film 14. The window 18 is selectively positioned relative to the circuit pattern openings 16 so that it can be used for aligning the photomask 10 with a corresponding wafer 22 (FIG. 2B) to be processed. The window 18 enables viewing of an alignment mark 24 provided on the wafer 22. The alignment mark 24 typically consists of one or more lines etched in a selected region of the wafer's surface, prior to wafer processing. In the embodiment shown, the subresolution openings 20 in the central area of the window 18 are arranged in a cross-shaped pattern 21 which matches the alignment mark scribed in the surface of the wafer 22 (FIG. 2B).

Figure 2A:
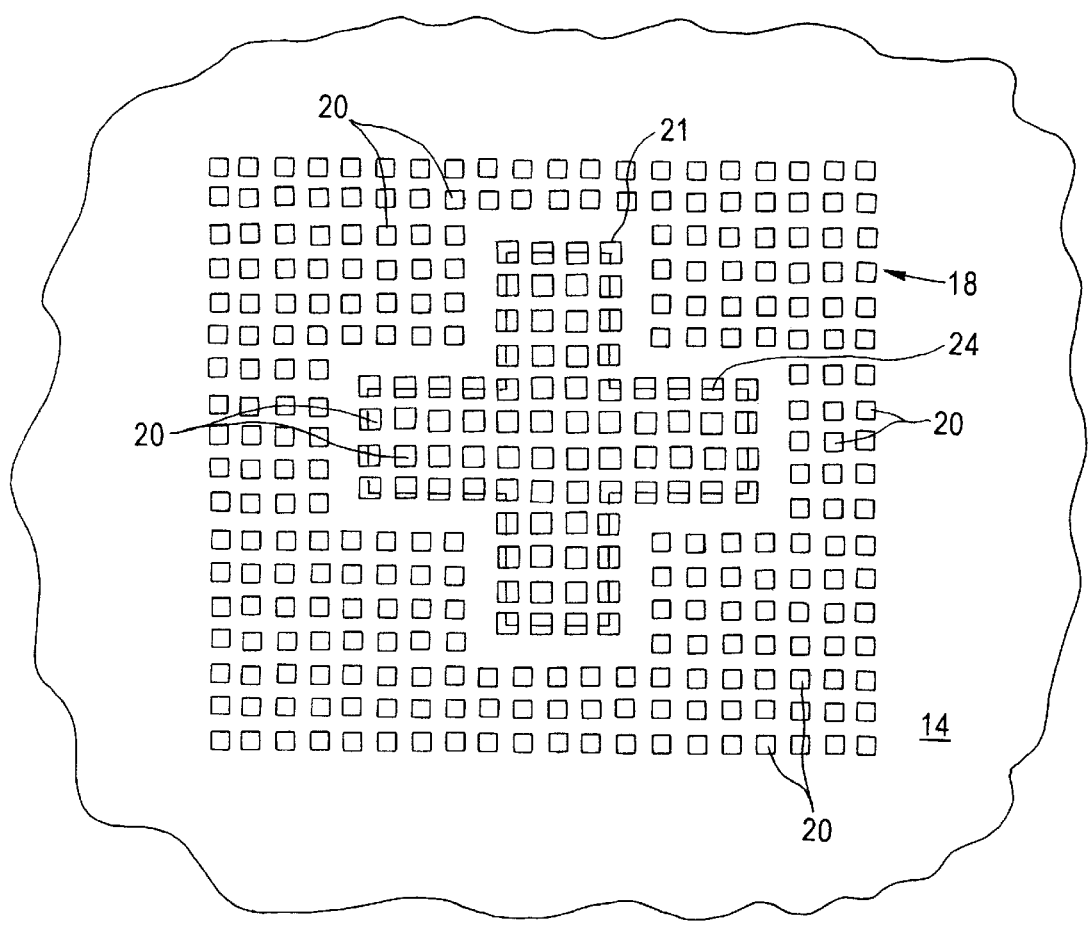
FIG. 2A is an enlarged plan view of the alignment mark window illustrating how it is used for locating an alignment mark on a wafer.
Figure 2B:
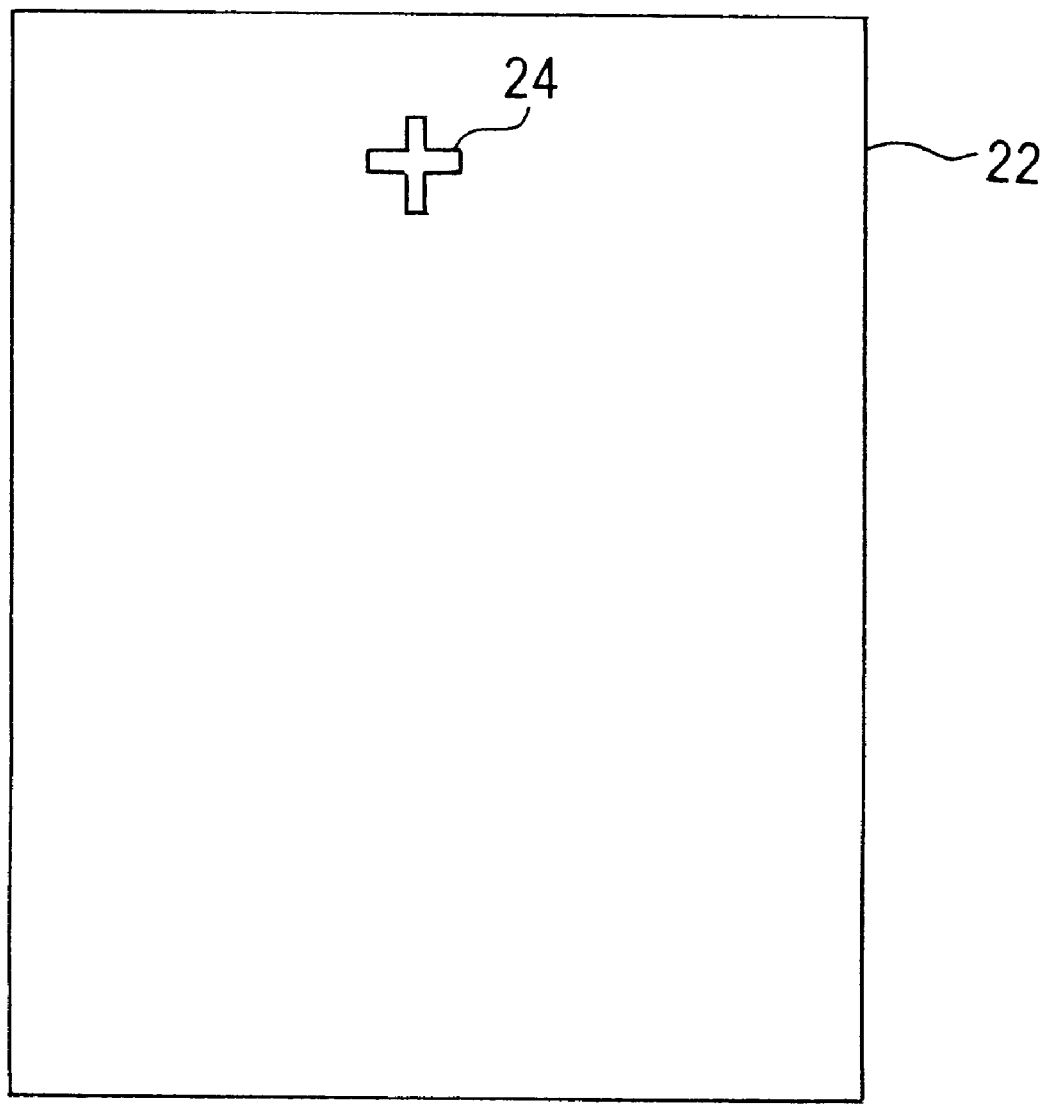
FIG. 2B is a plan view of a wafer to be patterned.

As shown in FIG. 2A, the subresolution alignment mark window 18 of the photomask 10 allows viewing of the alignment mark 24 on the surface of the wafer 22. Since the window 18 is indexed to the circuit pattern openings 16, aligning the alignment mark 24 of the wafer 22 within the window 18 (in the cross-shaped pattern 21) of the photomask 16, aligns the circuit pattern openings 16 (not visible in FIG. 2A) with the desired area of the wafer 22 (not visible in FIG.2A).

Referring again to FIG. 1B, the alignment mark window 18 is typically square in shape and has dimensions of about 500 microns in width by about 500 microns in length. This provides a large enough view to easily locate and align to the mark 24 on the wafer 22. The subresolution openings 20 are typically square in shape and about 8 microns in width by about 8 microns in length. In contrast, the openings 16 defining the circuit pattern features have dimensions which are much larger than those of the subresolution openings 20. For example, if the subresolution openings 20 have features which are about 8 microns, the circuit pattern feature openings 16 will be typically about 80 microns. Because the subresolution openings 20 are substantially smaller than the circuit pattern openings 16, the window pattern 20 is not transferred to the wafer 22 during photolithography. This is due to the fact that the subresolution openings 20 are each below the resolution limit of the pattern transfer process as will be explained below.

Figure 3:
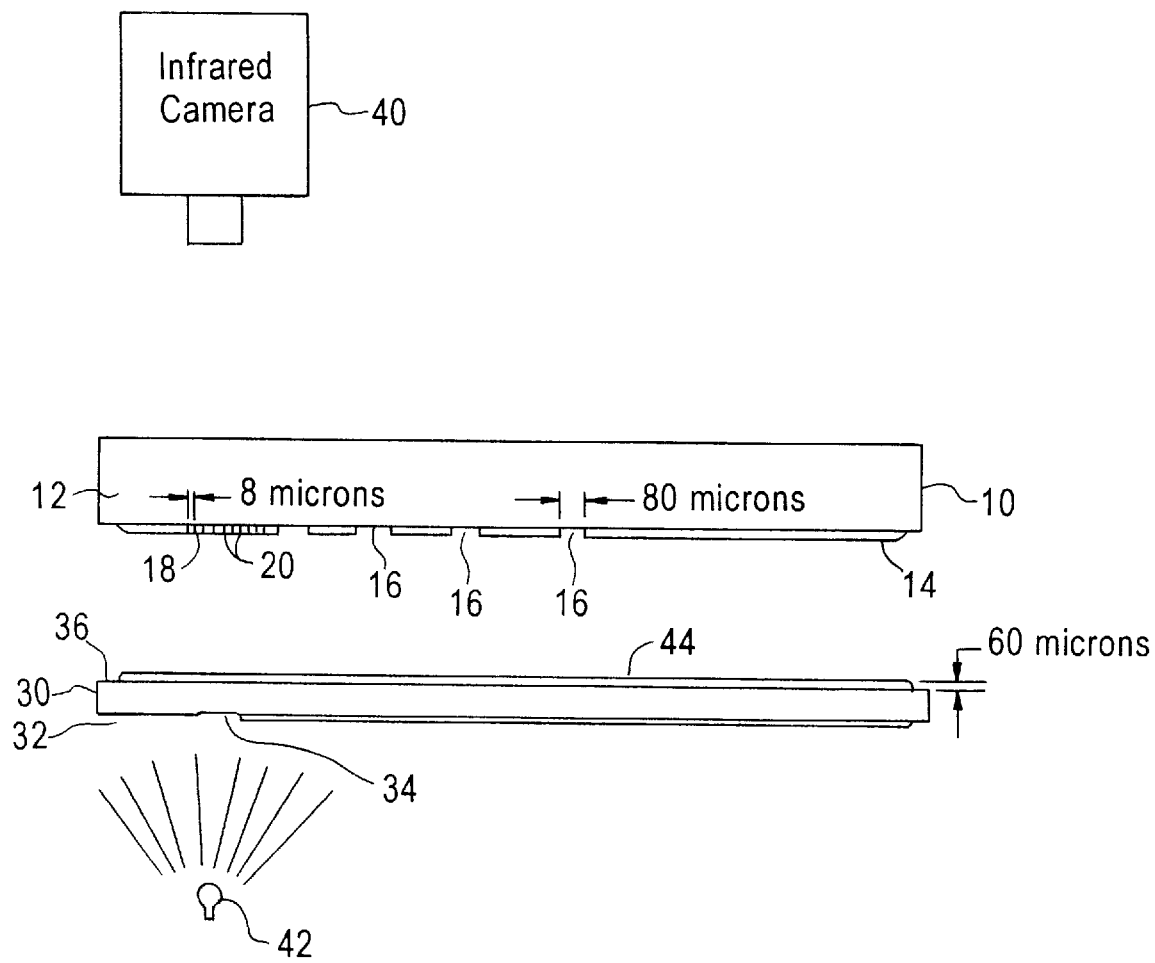
FIG. 3 shows the photomask of the invention as it used for patterning a resist mask layer deposited on a surface of a wafer.

FIG. 3 depicts the use of the photomask of the present invention. A mask pattern is exposed on the back of a wafer. The photomask 10 is aligned to global marks 34 on the front surface 32 of a thinned four-inch diameter gallium arsenide wafer 30 by projecting infrared light generated by an infrared light source 42 on the back surface 36 of the wafer 30 and viewing the marks 34 illuminated with the infrared light with an infrared camera 40 (gallium arsenide wafers are transparent to infrared light). A resist etch mask layer 44 deposited on the back surface 36 of the wafer 30 is then patterned using the photomask 10.

Figure 4A:
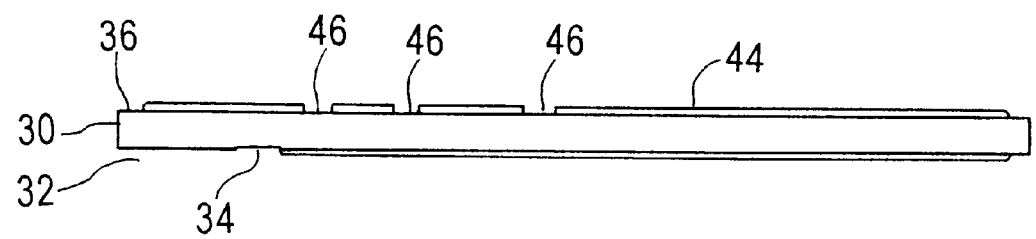
FIG. 4A is an elevational view of the wafer of FIG. 3 after patterning the resist mask layer.

FIG. 4A shows the wafer 30 after photolithography processing using the photomask 10. As can be seen, only the circuit feature openings are transferred to the resist mask layer 44 as denoted by numeral 46. The alignment mark window is not transferred to the resist mask layer 44.

Figure 4B:
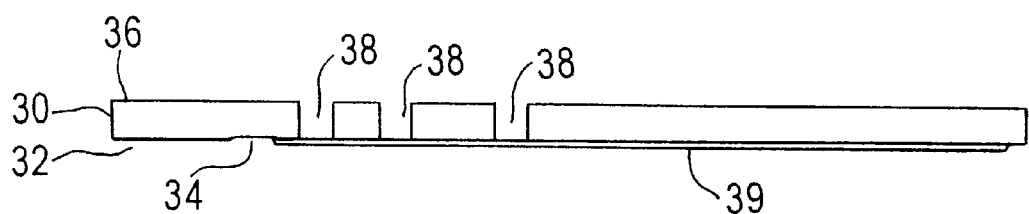
FIG. 4B is an elevational view of the wafer of FIG. 4A after etching the mask pattern.

FIG. 4B shows the wafer 30 after mask pattern etching. The mask pattern is etched through the gallium arsenide wafer 30 to contact metal features 39 on the front surface 32 of the wafer 30. The back surface 36 of the wafer is then metalized to provide a low inductance ground connection through the circuit feature holes (vias) 38 etched in the wafer 30.

If a hole the size of the entire alignment mark window was etched through the wafer as is the case with conventional photomasks, the circuit yield would likely decrease because of increased breakage, increased contamination and non-uniformity of the vias in close proximity to the window hole pattern exposed on the back of the wafer.

In the above example, the pattern transfer process resolution limit is controlled by the difference in the develop rates between the small and large features to be patterned in the resist mask layer 44. During patterning of the resist mask layer 44, diffraction of the patterning beam causes the edges of the patterns to be blurred which is more significant on smaller features than on larger features. If the resist mask layer 44 has a thickness of about 60 microns, the resist/window feature pattern aspect ratio will be about 7.5 (60 microns/8 microns) and the resist/circuit pattern feature aspect ratio will be about less than 1 (60 microns/80 microns). The comparatively high resist/window feature pattern aspect ratio aids in slowing the development of the window features (the subresolution openings 20) relative to the circuit features 16. As the develop depth of the small window features 20 in the resist mask layer increases, the develop rate becomes limited by the rate of diffiusion of the developer to the resist surface and the diffusion of the dissolved resist into the developer, thus further slowing the development of the small window features in the resist mask layer. Thus, the small window features 20 are not fully patterned in the resist mask layer 44. When the wafer 30 is etched, the alignment mark window pattern 18 is not transferred to the wafer 30.

While the foregoing invention has been described with reference to the above embodiment, various modifications and changes can be made without departing from the spirit of the invention. Accordingly, all such modifications and changes are considered to be within the scope of the appended claims.

What is claimed is:

1. A photolithography mask comprising a visible light-opaque film disposed on a surface of a transparent substrate, the film having at least one opening that defines an image of a circuit feature, and a window for viewing an alignment mark on an associated wafer, the window including an array of openings in the opaque film, each opening being of a dimension which is substantially below that of the opening defining the image of the circuit feature.

2. The mask according to claim 1, wherein the dimension of each array opening is about ten (10) times less than that of the opening defining the image of the circuit feature.

3. The mask according to claim 1, wherein the film is comprised of chromium.

4. The mask according to claim 1, wherein the window is about five hundred (500) microns by about five hundred (500) microns.

5. The mask according to claim 1, wherein each window opening has a dimension of about eight (8) microns.

6. The mask according to claim 1, wherein each window opening has a dimension of about eight (8) microns and the circuit feature opening has an dimension of about eighty (80) microns.

7. The mask according to claim 1, wherein the feature opening has a dimension of about eighty (80) microns.

8. A method of aligning a photolithography mask with a wafer to be patterned, the method comprising the steps of:

providing a photolithography mask having a visible-light-opaque film disposed on a surface of a transparent substrate, the film including at least one opening that defines an image of a circuit feature, and an alignment mark window, the window defined by an array of openings in the opaque film, each opening being of a dimension which is substantially below that of the opening defining the image of the circuit feature;

looking through the alignment mark window to view the alignment mark on the wafer; and positioning the alignment mark of the wafer within the alignment mark window of the mask.

9. The method according to claim 8, wherein the dimension of each array opening is about ten (10) times less than that of the opening defining the image of the circuit feature.

10. The method according to claim 8, further comprising a transparent substrate the opaque film covering a surface of the substrate.

11. The method according to claim 8, wherein the film is comprised of chromium.

12. The method according to claim 8, wherein the window is about five hundred (500) microns by about five hundred (500) microns.

13. The method according to claim 8, wherein each window opening has a dimension of about eight (8) microns.

14. The method according to claim 8, wherein each window opening has a dimension of about eight (8) microns and the circuit feature opening has an dimension of about eighty (80) microns.

15. The method according to claim 8, wherein the feature opening has a dimension of about eighty (80) microns.

* * * * *